United States Patent
Liu et al.

(10) Patent No.: US 9,448,486 B2
(45) Date of Patent: Sep. 20, 2016

(54) PHOTORESIST PATTERN TRIMMING COMPOSITIONS AND METHODS

(71) Applicant: Rohm and Haas Electronic Materials LLC, Marlborough, MA (US)

(72) Inventors: Cong Liu, Shrewsbury, MA (US); Seung-Hyun Lee, Gyeonggi Do (KR); Kevin Rowell, Brighton, MA (US); Gerhard Pohlers, Needham, MA (US); Cheng-Bai Xu, Southborough, MA (US); Wenyan Yin, Northborough, MA (US); Thomas A. Estelle, Northborough, MA (US); Shintaro Yamada, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/586,945

(22) Filed: Dec. 30, 2014

(65) Prior Publication Data
US 2015/0185620 A1    Jul. 2, 2015

Related U.S. Application Data

(60) Provisional application No. 61/922,080, filed on Dec. 30, 2013.

(51) Int. Cl.
*G03F 7/004* (2006.01)
*G03F 7/40* (2006.01)
*G03F 7/039* (2006.01)

(52) U.S. Cl.
CPC .............. *G03F 7/405* (2013.01); *G03F 7/0392* (2013.01)

(58) Field of Classification Search
CPC ........ G03F 7/004; G03F 7/40; G03F 7/0392; G03F 7/405; C08K 5/42
USPC ............... 430/311, 331, 270.1; 524/158, 160
See application file for complete search history.

(56) References Cited

U.S. PATENT DOCUMENTS

| | | | |
|---|---|---|---|
| 6,180,320 B1 | 1/2001 | Saito et al. | |
| 6,274,289 B1 | 8/2001 | Subramanian et al. | |
| 6,372,829 B1 | 4/2002 | Lamanna et al. | |
| 6,492,075 B1 | 12/2002 | Templeton et al. | |
| 7,338,750 B2 | 3/2008 | Kozawa et al. | |
| 7,862,982 B2 | 1/2011 | Burns et al. | |
| 8,067,148 B2 | 11/2011 | Endou et al. | |
| 9,209,028 B2 | 12/2015 | Xu et al. | |
| 9,209,035 B2 | 12/2015 | Xu | |
| 2003/0138736 A1 | 7/2003 | Nitta et al. | |
| 2005/0153232 A1* | 7/2005 | Li | G03F 7/0046 430/270.1 |
| 2006/0263728 A1 | 11/2006 | Shinbori et al. | |
| 2008/0063985 A1 | 3/2008 | Jung et al. | |
| 2010/0272967 A1* | 10/2010 | Chen | G03F 7/095 428/195.1 |
| 2011/0174774 A1 | 7/2011 | Lin et al. | |
| 2013/0171574 A1 | 7/2013 | Xu | |
| 2014/0186772 A1 | 7/2014 | Pohlers et al. | |
| 2014/0187027 A1 | 7/2014 | Xu et al. | |

FOREIGN PATENT DOCUMENTS

| | | |
|---|---|---|
| JP | 2002006512 A | 1/2002 |
| JP | 2002299202 A | 10/2002 |
| JP | 4329216 | 9/2009 |

OTHER PUBLICATIONS

Search report for corresponding Taiwan Search Report for Application No. 103146504 dated Oct. 6, 2015.

* cited by examiner

*Primary Examiner* — John S Chu
(74) *Attorney, Agent, or Firm* — Jonathan D. Baskin

(57) ABSTRACT

Provided are compositions and methods for trimming a photoresist pattern. The photoresist pattern trimming composition comprises: a matrix polymer comprising a unit formed from a monomer of the following general formula (I):

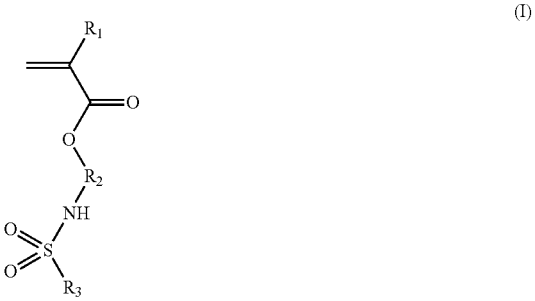

wherein: $R_1$ is chosen from hydrogen, fluorine, $C_1$-$C_3$ alkyl and $C_1$-$C_3$ fluoroalkyl; $R_2$ is chosen from $C_1$-$C_{15}$ alkylene; and $R_3$ is chosen from $C_1$-$C_3$ fluoroalkyl; an aromatic acid that is free of fluorine; and a solvent. The compositions and methods find particular applicability in the manufacture of semiconductor devices.

18 Claims, 1 Drawing Sheet

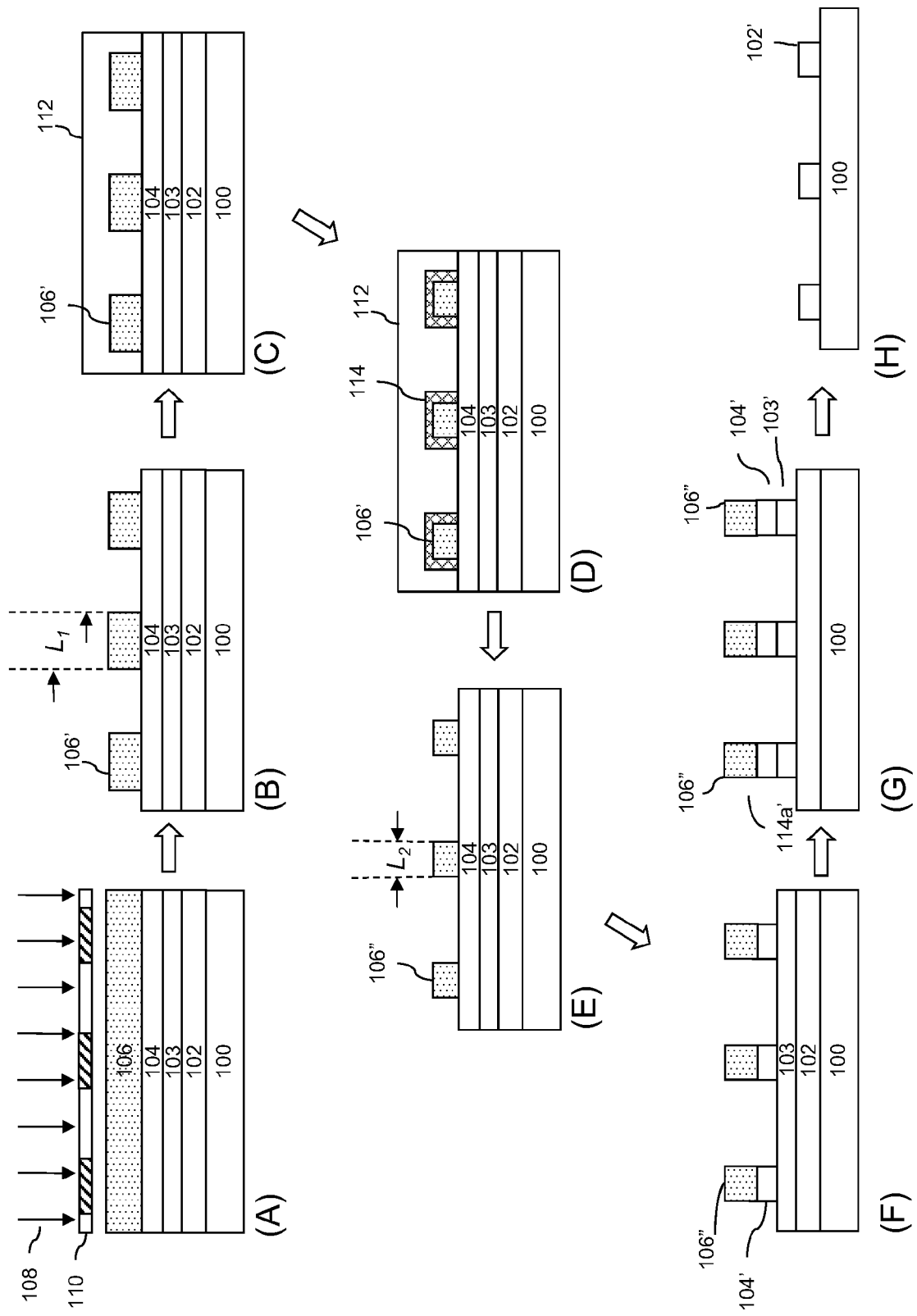

PHOTORESIST PATTERN TRIMMING COMPOSITIONS AND METHODS

This application claims the benefit of priority under 35 U.S.C. §119(e) to U.S. Provisional Application No. 61/922,080, filed Dec. 30, 2013, the entire contents of which are incorporated herein by reference.

BACKGROUND

The invention relates generally to the manufacture of electronic devices. More specifically, this invention relates to compositions and methods for trimming photoresist patterns useful in shrink processes for the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. Photoresist materials further find use, for example, in semiconductor manufacture in the formation of ion implantation masks. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing in optical lithography. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. In a positive tone development (PTD) process, exposed regions of the resist are soluble in the aqueous alkaline developer and are removed from the substrate surface, whereas unexposed regions, which are insoluble in the developer, remain after development to form a positive image.

The theoretical resolution limit as defined by the Rayleigh equation for optical imaging tools is shown below:

$$R = k_1 \frac{\lambda}{NA}$$

where $k_1$ is the process factor, $\lambda$ is the wavelength of the imaging tool and NA is the numerical aperture of the imaging lens. The theoretical resolution limit for printing line and space patterns for standard 193 nm dry lithography, assuming NA=0.9 and $k_1$=0.25, is 54 nm. This means that a 193 nm dry immersion tool would only be capable of resolving 54 nm half-pitch line and space patterns. For 193 nm immersion lithography (NA=1.35, $k_1$=0.25), the theoretical resolution limit is reduced to 36 nm. The resolution for printing contact holes or arbitrary 2D patterns is further limited due to the low aerial image contrast with a dark field mask wherein the theoretical limit for $k_1$ is generally higher than that for line and space patterns.

To form finer photoresist patterns than attainable by direct imaging alone, photoresist pattern trimming processes have been proposed. U.S. Pat. No. 6,492,075B1, for example, discloses a method of trimming a patterned resist. The method involves the steps of: providing a patterned resist having structural features of a first size, the patterned resist containing a polymer having a labile group; contacting a coating containing at least one cleaving compound to form a thin deprotected resist layer at an interface between the patterned resist and the coating; and removing the coating and the thin deprotected resist layer leaving the patterned resist having structural features of a second size that is smaller than the first size. This document discloses laundry lists of various cleaving compounds chosen from acids, bases, and organic compounds, and a number of possible polymers for use in the trimming compositions.

There is a continuing need in the art for improved lithographic methods useful in electronic device fabrication that provide increased resolution over that obtained by direct optical imaging which are capable of forming fine lithographic patterns with controllably reduced resist pattern dimensions.

SUMMARY OF THE INVENTION

In accordance with a first aspect of the invention, photoresist pattern trimming compositions are provided. The compositions comprise: a matrix polymer comprising a unit formed from a monomer of the following general formula (I):

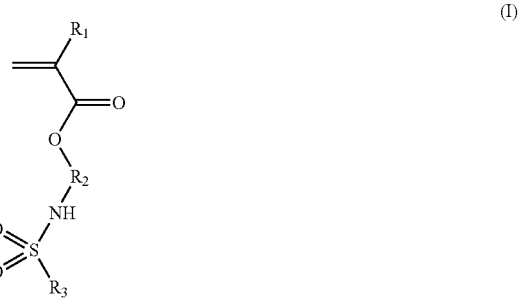

wherein: $R_1$ is chosen from hydrogen, fluorine, $C_1$-$C_3$ alkyl and $C_1$-$C_3$ fluoroalkyl; $R_2$ is chosen from $C_1$-$C_{15}$ alkylene; and $R_3$ is chosen from $C_1$-$C_3$ fluoroalkyl; an aromatic acid that is free of fluorine; and a solvent.

In accordance with a further aspect of the invention, methods of trimming a photoresist pattern are provided. The methods comprise: (a) providing a semiconductor substrate; (b) forming a photoresist pattern on the substrate, wherein the photoresist pattern is formed from a chemically amplified photoresist composition comprising: a matrix polymer comprising an acid labile group, a photoacid generator and a solvent; (c) coating a photoresist trimming composition on the substrate over the photoresist pattern, wherein the photoresist trimming composition comprises a matrix polymer, an aromatic acid that is free of fluorine, and a solvent, wherein the photoresist trimming composition comprises a unit formed from a monomer of the following general formula (I):

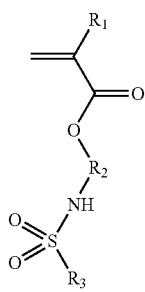

(I)

wherein $R_1$ is chosen from hydrogen, fluorine, $C_1$-$C_3$ alkyl and $C_1$-$C_3$ fluoroalkyl, $R_2$ is chosen from $C_1$-$C_8$ alkylene and $R_3$ is chosen from $C_1$-$C_3$ fluoroalkyl; (d) heating the coated substrate, thereby causing a change in polarity of the photoresist matrix polymer in a surface region of the photoresist pattern; and (e) contacting the photoresist pattern with a rinsing agent to remove the surface region of the photoresist pattern, thereby forming a trimmed photoresist pattern.

Photoresist pattern trimming compositions and methods of the invention can produce very fine lithographic patterns, with controllably reduced resist pattern dimensions. Other advantages of the compositions and method can include one or more of good iso/dense bias and improved process window for the formation of isolated patterns such as isolated lines and posts.

DESCRIPTION OF THE DRAWINGS

The present invention will be described with reference to the following drawing, in which like reference numerals denote like features, and in which:

FIG. 1A-H illustrates a process flow for forming a photolithographic pattern in accordance with the invention.

DETAILED DESCRIPTION

Photoresist Pattern Trimming Compositions

The photoresist pattern trimming compositions include a matrix polymer, an aromatic acid that is free of fluorine and a solvent, and can include optional additional components. When coated over a photoresist pattern formed from a chemically amplified photoresist composition, the photoresist trimming compositions can provide very fine lithographic patterns, with controllably reduced resist pattern dimensions, and may provide good Iso/Dense Bias and process window for the formation of isolated patterns such as isolated lines and posts.

The matrix polymer allows for the compositions to be coated over the photoresist pattern in the form of a layer having a desired thickness. This will help to ensure the presence of a sufficient content of acid for interaction with the photoresist pattern surface.

The matrix polymer should have good solubility in the rinsing solution to be used in the trimming process. For example, the matrix polymer can be soluble in an aqueous alkaline developer, preferably aqueous quaternary ammonium hydroxide solutions such as aqueous tetramethylammonium hydroxide, or in water. To minimize residue defects originated from the overcoat materials, the dissolution rate of a dried layer of the trimming composition should be greater than that of the photoresist pattern surface region to be removed by the developer solution. The matrix polymer typically exhibits a developer dissolution rate of 100 Å/second or higher, preferably 1000 Å/second or higher. The matrix polymer is soluble in the solvent of the trimming composition, described herein.

The matrix polymer comprises a unit formed from a monomer of the following general formula (I):

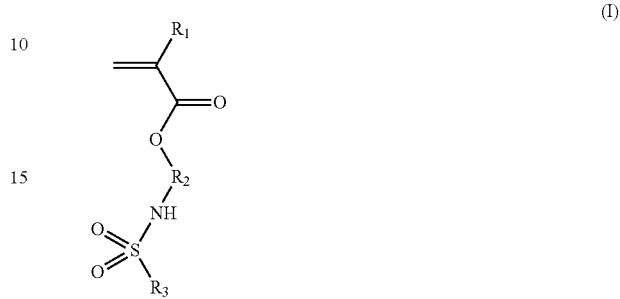

(I)

wherein: $R_1$ is chosen from hydrogen, fluorine, $C_1$-$C_3$ alkyl and $C_1$-$C_3$ fluoroalkyl, typically hydrogen or methyl; $R_2$ is chosen from $C_1$-$C_{15}$ alkylene, and may be straight-chained, branched, cyclic or a combination thereof; and $R_3$ is chosen from $C_1$-$C_3$ at least partially fluorinated alkyl, typically perfluoroalkyl, and may be straight-chained or branched. The unit formed from the monomer of general formula (I) is believed to impart good solubility properties to the matrix polymer when developed with an aqueous base rinsing solution or water. Monomers of general formula (I) can be prepared by known techniques and are commercially available.

Suitable monomers of general formula (I) include, for example, the following:

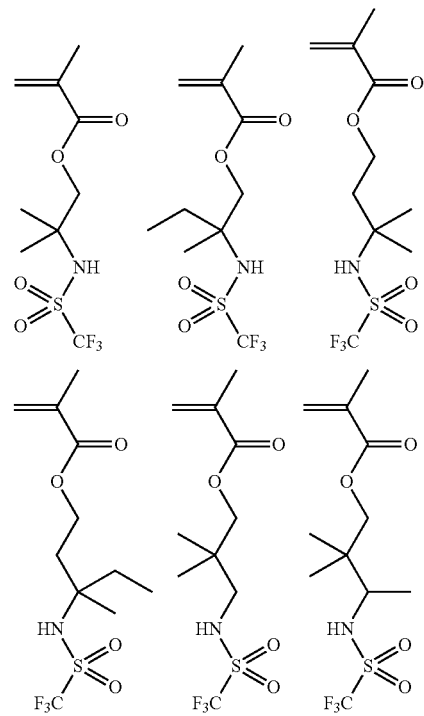

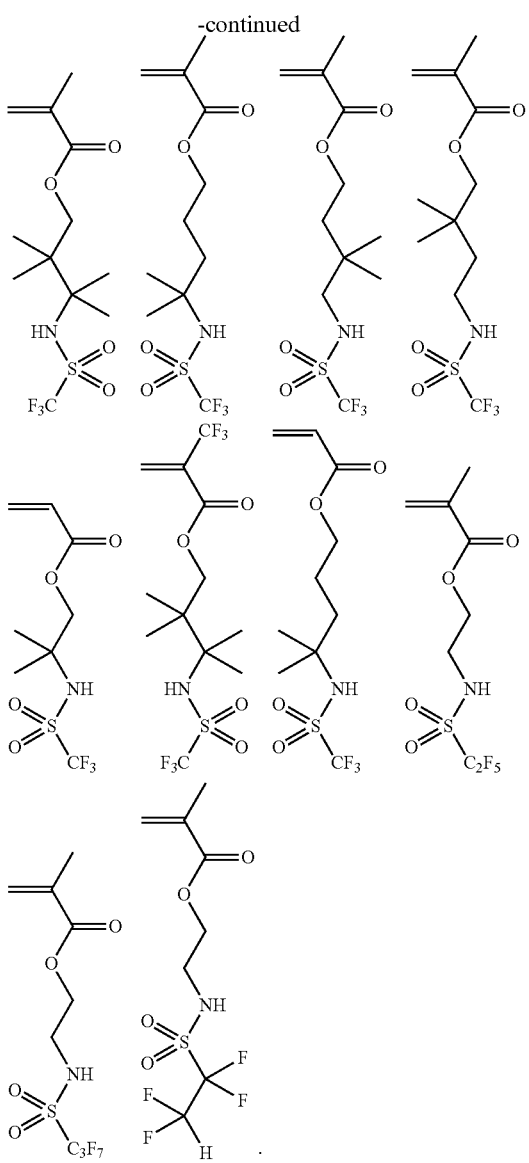

The unit formed from the monomer of general formula (I) is typically present in the matrix polymer in an amount of from 5 to 100 mol %, for example, from 30 to 95 mol % or from 50 to 90 mol %, based on the polymer.

The matrix polymer can include one or more additional types of unit formed from other monomer(s) of the general formula (I) and/or other different units. The polymer can, for example, include one or more additional units for purposes of adjusting one or more of glass transition temperature $T_g$, surface properties and dissolution rate of the film. The one or more additional units can include one or more functional groups chosen from, for example, hydroxyl, carboxyl, sulfonic acid, silanol, fluoroalcohols, anhydrates, lactones, esters, ethers, allylamine, pyrolidones and combinations thereof. Of these, fluoroalcohol and sulfonic acid groups are preferred.

The fluoroalcohol group can be partially or completely fluorinated, with a hexafluoroalcohol group being typical. Suitable units containing a fluoroalcohol group include, for example, those formed from a monomer represented by the following general formula (II):

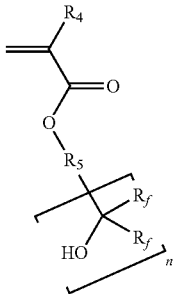

wherein: $R_4$ is chosen from hydrogen, fluorine, $C_1$-$C_3$ alkyl and $C_1$-$C_3$ fluoroalkyl, typically hydrogen or methyl; $R_5$ is an n+1 valent group chosen from $C_1$-$C_{15}$ alkylene, and may be straight-chained, branched, cyclic or a combination thereof; and $R_f$'s are independently chosen from $C_1$-$C_3$ fluoroalkyl, typically $CF_3$, and may be straight-chained or branched; and n is an integer from 1 to 4, typically 1 or 2.

Suitable monomers of general formula (II) include, for example, the following:

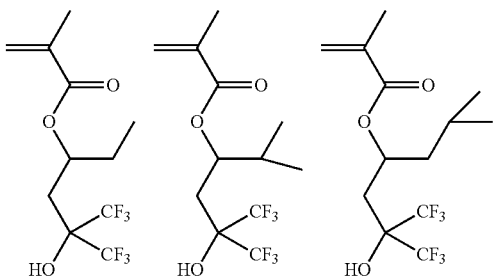

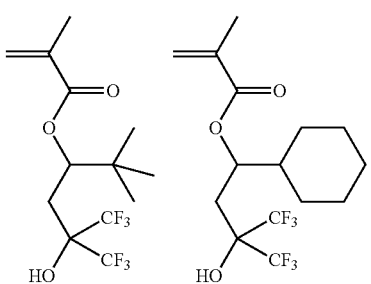

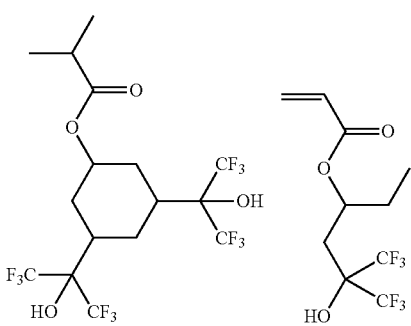

-continued

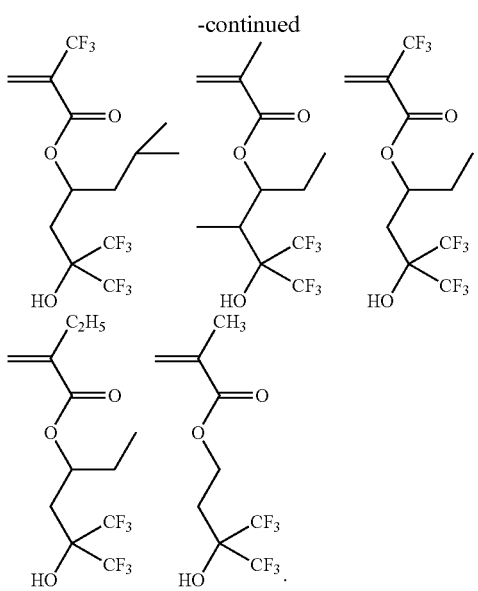

The unit containing a fluoroalcohol group can be present in the matrix polymer in an amount of from 0 to 95 mol %, for example, from 30 to 70 mol %, based on the polymer.

Suitable monomers containing sulfonic acid groups for use in forming the matrix polymer include, for example, the following:

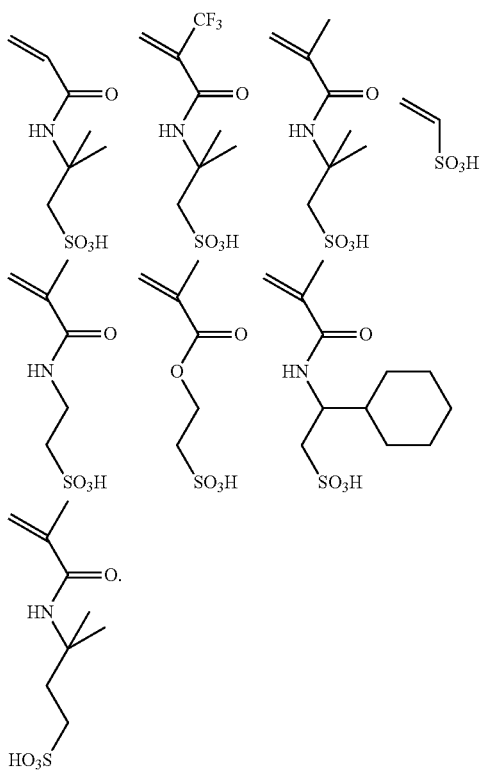

Units containing a sulfonic acid group if used are typically present in the matrix polymer in an amount of from 0 to 20 mol %, for example, from 1 to 10 mol %, based on the polymer.

The matrix polymer is typically made up only of poly(meth)acrylate and/or poly(meth)acrylamide units, but may include units having other polymerizable groups, for example, vinyl and norbornene, and combinations thereof. Suitable matrix polymers in accordance with the invention include, for example, the following:

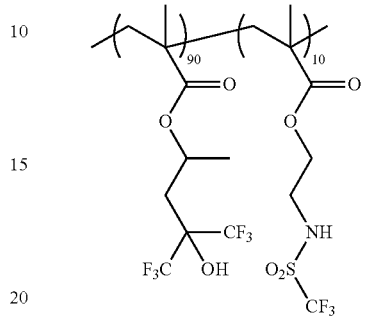

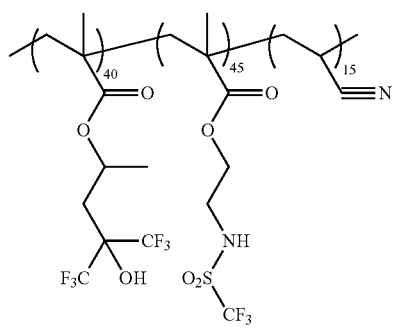

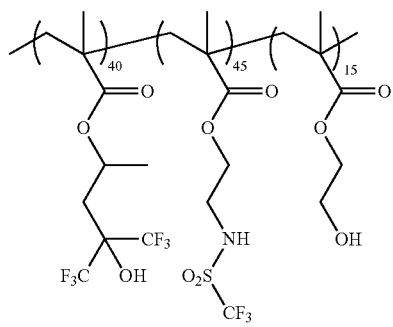

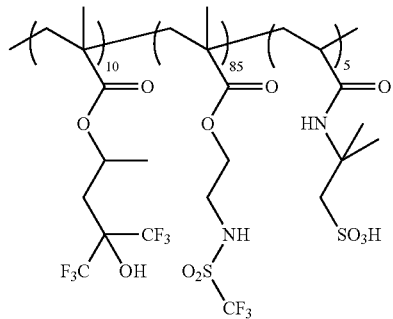

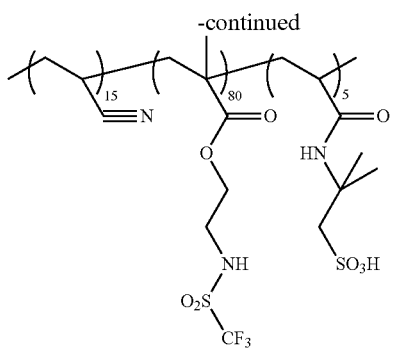

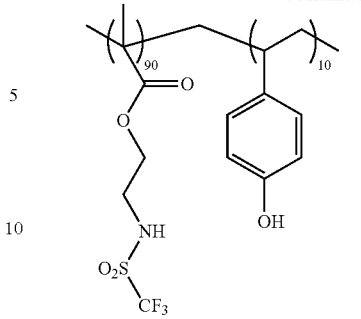

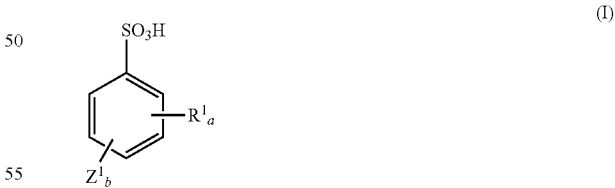

wherein the unit contents are in mol %.

The content of the matrix polymer in the composition will depend, for example, on the target thickness of the layer, with a higher polymer content being used for thicker layers. The matrix polymer is typically present in the compositions in an amount of from 80 to 99 wt %, more typically from 90 to 98 wt %, based on total solids of the trimming composition. The weight average molecular weight of the polymer is typically less than 400,000, preferably from 3000 to 50,000, more preferably from 3000 to 25,000.

Polymers useful in the overcoat compositions can be homopolymers or can be copolymers having a plurality of distinct repeat units, for example, two, three or four distinct repeat units. The trimming compositions typically include a single polymer, but can optionally include one or more additional polymer. Suitable polymers and monomers for use in the overcoat compositions are commercially available and/or can readily be made by persons skilled in the art.

The trimming compositions further include one or more aromatic acid that is free of fluorine. Fluorine-free aromatic acids can be more environmentally friendly than fluorinated acids. In the case of a photoresist based on deprotection reaction, the acid with heat can cleave the bond of acid labile groups in the photoresist pattern.

The aromatic acid is preferably a sulfonic acid comprising a phenyl, biphenyl, naphthyl, anthracenyl, thiophene or furan group. The aromatic acid is preferably chosen from one or more aromatic sulfonic acids of the following general formulas (I)-(VI):

(I)

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a+b is 5 or less;

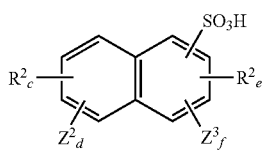

(II)

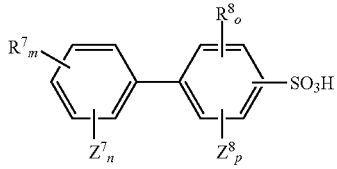

(V)

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less;

wherein: $R^7$ and $R^8$ each independently represents a substituted or unsubstituted C1-C20 alkyl group, a substituted or unsubstituted C5-C14 aryl group or a combination thereof, optionally containing one or more group chosen from carboxyl, carbonyl, carbonyloxy, sulfonamido, ether, thioether, a substituted or unsubstituted alkylene group, or a combination thereof; $Z^7$ and $Z^8$ each independently represents a group chosen from hydroxy, nitro, cyano, C1 to C5 alkoxy, formyl and sulfonic acid; m and n are independently an integer from 0 to 5; m+n is 5 or less; o and p are independently an integer from 0 to 4; and o+p is 4 or less; and

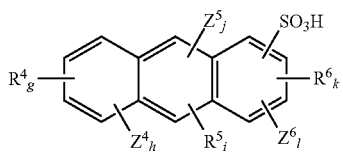

(III)

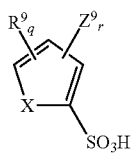

(VI)

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+l is 3 or less;

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; and q+r is 3 or less. For each of the structures, it should be clear that the $R^1$-$R^9$ groups can optionally form a fused structure together with their respective associated rings. The aromatic acid is typically present in the compositions in an amount of from 0.01 to 20 wt %, more typically from 0.1 to 10 wt % or from 1 to 5 wt %, based on total solids of the trimming composition.

Exemplary aromatic acids for use in the pattern trimming compositions include, without limitation, the following:

(IV)

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; and k+l is 4 or less;

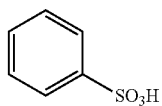 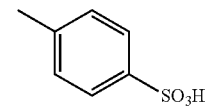

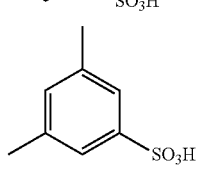 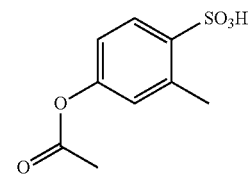

-continued
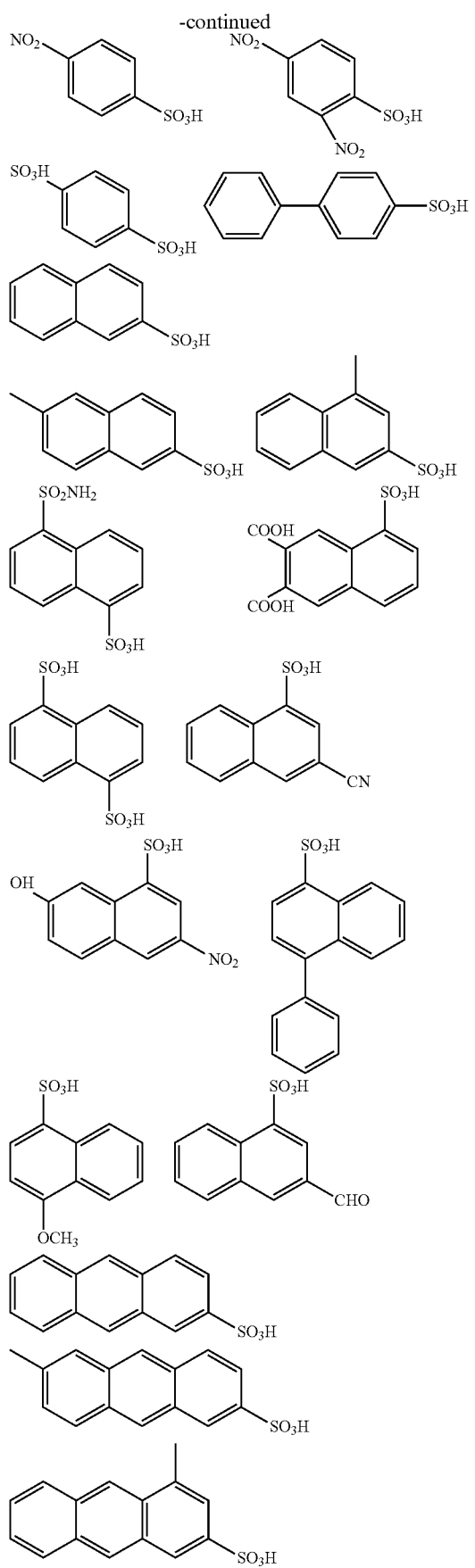
-continued
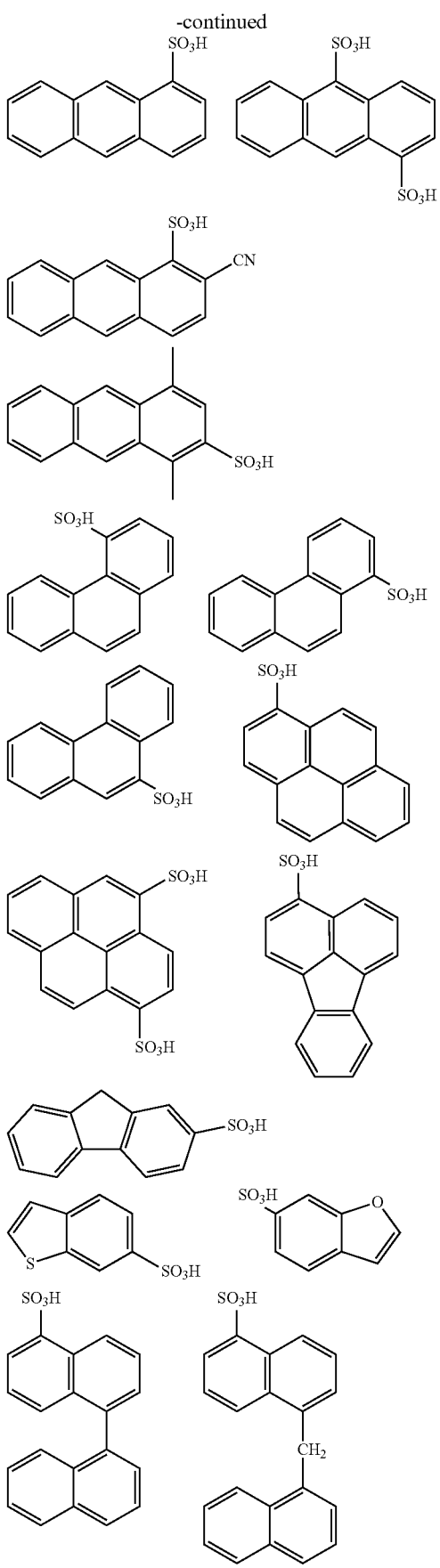

-continued

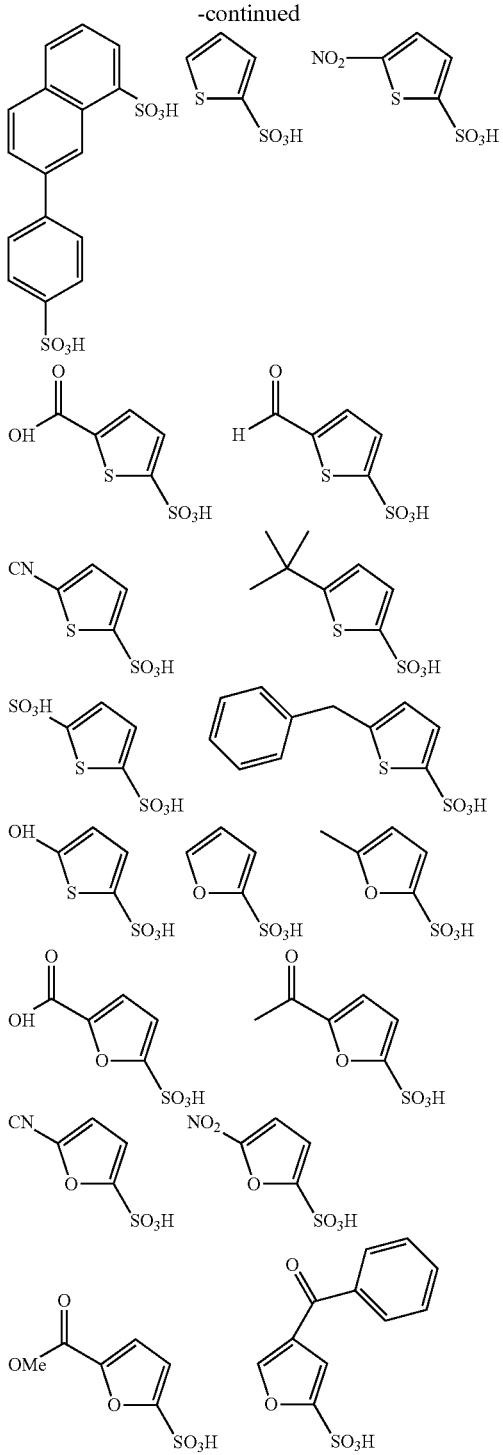

The trimming compositions further include a solvent or solvent mixture. The trimming compositions can take the form of an aqueous solution. Suitable solvent materials to formulate and cast the trimming compositions exhibit very good solubility characteristics with respect to the non-solvent components of the trimming composition, but do not appreciably dissolve the underlying photoresist pattern so as to minimize intermixing. The solvent is typically chosen from water, organic solvents and mixtures thereof. Suitable organic solvents for the trimming composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic $C_4$-$C_9$ monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents. Of these organic solvents, alcohols, aliphatic hydrocarbons and ethers are preferred. The solvent component of the trimming composition is typically present in an amount of from 90 to 99 wt % based on the trimming composition.

The trimming compositions may include optional additives. For example, the trimming compositions can include an additional component that reacts with surface region of the resist pattern, rendering the surface region soluble in an organic solvent rinsing agent. This optional component preferably contains functional groups chosen from —OH, —NH, —SH, ketones, aldehydes, —SiX wherein X is a halogen, vinyl ethers and combinations thereof. Without wishing to be bound by any particular theory, it is believed that the component diffuses into the resist pattern and reacts with carboxylic acid groups of the pattern. This reaction results in a polarity change of the surface, rendering the surface soluble in the organic solvent. This component can be useful, for example, where the photoresist pattern is formed by negative tone development (NTD) wherein the pattern is composed of exposed portions of the photoresist comprising acid-labile groups. Such component if used is typically present in an amount of from 0.1 to 10 wt % based on total solids of the trimming composition.

The trimming composition can further include a surfactant. Typical surfactants include those which exhibit an amphiphilic nature, meaning that they can be both hydrophilic and hydrophobic at the same time Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the trimming composition.

The trimming compositions are preferably free of cross-linking agents as such materials can result in a dimensional increase of the resist pattern.

The trimming compositions can be prepared following known procedures. For example, the compositions can be prepared by dissolving solid components of the composition in the solvent components. The desired total solids content of the compositions will depend on factors such as the desired final layer thickness. Preferably, the solids content of the trimming compositions is from 1 to 10 wt %, more preferably from 1 to 5 wt %, based on the total weight of the composition.

Photoresist Pattern Trimming Methods

Processes in accordance with the invention will now be described with reference to FIG. 1A-H, which illustrates an exemplary process flow for forming a photolithographic pattern using a photoresist pattern trimming technique in accordance with the invention. While the illustrated process flow is of a positive tone development process, the invention is also applicable to negative tone development (NTD) processes. Also, while the illustrated process flow describes a patterning process in which a single resist mask is used to transfer the trimmed photoresist pattern to the underlying substrate, it should be clear that the trimming method can be used in other lithographic processes, for example, in double patterning processes such as litho-litho-etch (LLE), litho-etch-litho-etch (LELE) or self-aligned double patterning (SADP), as an ion implantation mask, or any other lithographic process where trimming of a photoresist pattern would be beneficial.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 106 formed from a chemically amplified photosensitive composition comprising a matrix polymer having acid labile groups is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm or sub-200 nm such as 193 nm or an EUV wavelengths (e.g., 13.4 or 13.5 nm), with 193 nm (immersion or dry lithography) and EUV being preferred. The exposure energy is typically from about 10 to 80 mJ/cm$^2$, dependent upon the exposure tool and the components of the photosensitive composition.

Following exposure of the photoresist layer 106, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

The photoresist layer 106 is next developed to remove exposed regions of the layer, leaving unexposed regions forming a resist pattern 106' having a plurality of features as shown in FIG. 1B. The features are not limited and can include, for example, a plurality of lines and/or cylindrical posts which will allow for the formation of line and/or contact hole patterns in the underlying layers to be patterned. The formed patterns have an initial dimension shown as $L_1$, a linewidth in the case of line patterns or post diameter for post patterns. In the case of a negative tone development process, where unexposed regions of the photoresist layer are removed and exposed regions remain to form the resist pattern, an organic solvent developer is employed. The organic developer can, for example, be a solvent chosen from ketones, esters, ethers, hydrocarbons, and mixtures thereof, with 2-heptanone and n-butyl acetate being typical.

A layer 112 of a photoresist pattern trimming composition as described herein is formed over the photoresist pattern 106' as shown in FIG. 1C. The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming layer 112 is from 200 to 1500 Å.

As shown in FIG. 1D, the substrate is next baked to remove solvent in the trimming layer, to allow for the free acid to diffuse into the surface of the underlying resist pattern 106' and the polarity-changing reaction in the resist pattern surface region 114. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern is next contacted with a rinsing agent, typically a developing solution, to remove the residual trimming composition layer 112 and the surface region 114 of the photoresist pattern, with the resulting trimmed pattern 106" being shown in FIG. 1E. The rinsing agent is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, an organic solvent developer can be used, for example, a solvent chosen from ketones, esters, ethers, hydrocarbons, and mixtures thereof, such as 2-heptanone and n-butyl acetate. The rinsing agent can further be or comprise water. The resulting structure is shown in FIG. 1E. The resist pattern after trimming has a dimension ($L_2$) that is smaller as compared with the feature size prior to trimming.

Using the resist pattern 106" as an etch mask, the BARC layer 104 is selectively etched to form BARC patterns 104', exposing the underlying hardmask layer 103, as shown in FIG. 1F. The hardmask layer is next selectively etched, again using the resist pattern as an etch mask, resulting in patterned BARC and hardmask layer 103', as shown in FIG. 1G. Suitable etching techniques and chemistries for etching the BARC layer and hardmask layer are known in the art and will depend, for example, on the particular materials of these layers. Dry-etching processes such as reactive ion etching are typical. The resist pattern 106" and patterned BARC layer 104' are next removed from the substrate using known techniques, for example, oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching or a wet strip. The resulting structure is a pattern of etched features 102' as illustrated in FIG. 1H. In an alternative exemplary method, it may be desirable to pattern the layer 102 directly using the photoresist pattern 106" without the use of a hardmask layer 103. Whether direct patterning with the resist patterns can be employed will depend on factors such as the materials involved, resist selectivity, resist pattern thickness and pattern dimensions.

The following non-limiting examples are illustrative of the invention.

EXAMPLES

Polymer Synthesis

The following monomers were used in the following examples for the matrix polymer, surface active polymer and additive polymer synthesis. Monomer ratios are on a weight percentage (wt %) basis based on the polymer.

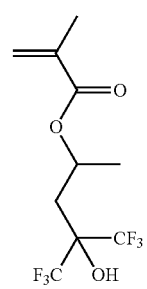

M1

-continued

M2

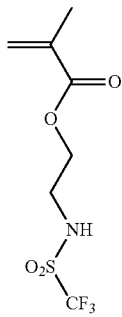

M3

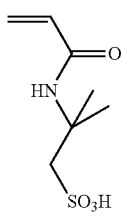

A monomer feed solution was prepared by combining 118.44 g 4-methyl-2-pentanol (4M2P), 78.98 g monomer M1 and 8.78 g monomer M2 in a container and agitating the mixture to dissolve the two monomers. An initiator feed solution was prepared by combining 2.63 g Vazo™ 67 free radical initiator (E. I. du Pont de Nemours and Company) and 85.06 g 4M2P in a suitable container and agitating the mixture to dissolve the initiator. 206.13 g 4M2P was introduced into a reaction vessel and the vessel was purged with nitrogen gas for 30 minutes. The reaction vessel was next heated to 97° C. with agitation. Introduction of the monomer feed solution and initiator feed solution into the reaction vessel was simultaneously started. The monomer feed solution was fed over a period of 2 hours and the initiator feed solution over a period of 3 hours. The reaction vessel was maintained at 97° C. for an additional 2 hours with agitation, and then allowed to cool to room temperature. Polymer P1 was thereby formed. The weight average molecular weight (Mw) of the copolymer was 9,359 Daltons.

Polymers P2-P4 were synthesized employing a procedure similar to that used for Polymer P1. Table 1 shows the weight percentages of the monomers based on the polymer, $M_w$, and PDI of the polymers.

TABLE 1

| Polymer | M1 | M2 | M3 | Mw | PDI |
|---------|----|----|----|------|-----|
| P1 | 90 | 10 |   | 9359 | 1.6 |
| P2 | 50 | 50 |   | 10034 | 1.6 |
| P3 |   | 100 |   | 13825 | 2.6 |
| P4 |   | 95 | 5 | 25800 | 2.2 |

Photoresist Pattern Trimming Compositions

Example 1

1.67 g of Polymer P1, 0.077 g p-toluenesulfonic acid (pTSA), 15.65 g isoamyl ether (IAE) and 62.61 g 2-methyl-1-butynol (4M2P) were mixed until all components dissolved and the mixture was filtered with a 0.05 micron UPE filter, resulting in a photoresist trimming composition (PTC 1).

Examples 2-4

Example 2-4(PTC 2-4) were formulated in the same manner described above for Example 1, except using the components and amounts set forth in Table 2.

TABLE 2

| Ex. | Trim Comp'n | Polymer | pTSA | 4M2P | IAE |
|-----|-------------|---------|------|------|-----|
| Ex. 1 | PTC-1 | P1 | 1.67 | 0.077 | 62.61 | 15.65 |
| Ex. 2 | PTC-2 | P2 | 1.67 | 0.077 | 62.61 | 15.65 |
| Ex. 3 | PTC-3 | P3 | 1.67 | 0.077 | 62.61 | 15.65 |
| Ex. 4 | PTC-4 | P4 | 1.67 | 0.077 | 62.61 | 15.65 |

All values in grams (g).

Photoresist Patterned Wafer Preparation 200 mm silicon wafers were spin-coated with AR™40A antireflectant (Dow Electronic Materials) to form a first bottom antireflective coating (BARC) on a TEL ACT-8 (Tokyo Electron) coating track. The wafers were baked for 60 seconds at 215° C., yielding a BARC film thickness of 800 Å. EPIC™ 2096 positive photoresist (Dow Electronic Materials) was coated on the BARC-coated wafers and soft-baked at 120° C. for 60 seconds to provide a resist layer thickness of 900 Å. The wafers were exposed using an ASML/1100, 0.75 NA stepper operating at 193 nm through a photomask with PSM feature size of 120 nm 1:1 and 1:8 Line/Space pattern, under dipole-35Y with outer/inner sigma of 0.89/0.64. The exposed wafers were post-exposure baked at 95° C. for 60 seconds and developed with TMAH developer (2.38 wt %) to form resist patterns. CDs for the 1:1 and 1:8 patterns were determined by processing the image captured by top-down scanning electron microscopy (SEM) using a Hitachi 9380 CD-SEM, operating at an accelerating voltage of 800 volts (V), probe current of 8.0 picoamperes (pA), using 200 Kx magnification. The results of the CD measurements are shown in Table 3.

Photoresist Pattern Trimming

Examples 5-8

The photoresist patterned wafers were coated with a 60 nm film of each of the photoresist pattern trimming compositions of Examples 1-4 by spin-coating on the patterned wafers, baking at 70° C. for 60 seconds on a hotplate and rinsing with TMAH (2.38 wt %) for 12 seconds with a TEL LD nozzle. CDs for the 1:1 and 1:8 patterns were again determined using the same procedure as for the original image. Iso/Dense Bias was calculated based on the pre- and post trimming CD measurements by the following equation:

$$IDB = \Delta CD_{1:8} - \Delta CD_{1:1}$$

wherein: IDB=Iso/Dense Bias; $\Delta CD_{1:8}$=[(CD of the 120 nm 1:8 pattern before trimming)−(CD of the 120 nm 1:8 pattern after trimming)]; and $\Delta CD1:1$=[(CD of the 120 nm 1:1 pattern before trimming)−(CD of the 120 nm 1:1 pattern after trimming)]. Iso/Dense Bias provides an indication of whether an existing photomask can be used to print isolated and dense patterns on the mask without the need for Optical Proximity Correction (OPC). If OPC is required, a new photomask is typically required. An Iso/Dense Bias of 10 nm or more was considered poor and less than 10 nm was considered good. The results for the CD measurements and Iso/Dense Bias calculation are provided in Table 3.

TABLE 3

| Ex. | Trim Composition | L1<sub>1.8:1</sub> | L2<sub>1.8:1</sub> | L1<sub>1:1</sub> | L2<sub>1:1</sub> | Iso/Dense Bias |
|---|---|---|---|---|---|---|
| Ex. 5 | PTC1 | 120.1 | 73.5 | 120.0 | 82.6 | 9.2 |
| Ex. 6 | PTC2 | 120.1 | 73.8 | 120.0 | 82.8 | 9.1 |
| Ex. 7 | PTC3 | 120.1 | 74.8 | 120.0 | 83.0 | 8.3 |
| Ex. 8 | PTC4 | 120.1 | 86.6 | 120.0 | 88.1 | 1.6 |

$L1_{1.8:1}$ = CD of the 120 nm 1:8 pattern before trimming; $L2_{1.8:1}$ = CD of the 120 nm 1:8 pattern after trimming; $L1_{1:1}$ = CD of the 120 nm 1:1 pattern before trimming; and $L2_{1:1}$ = CD of the 120 nm 1:1 pattern after trimming. All values in nm.

The results show that the photoresist patterns for both the 120 nm 1:8 and 1:1 patterns were effectively reduced by the trimming compositions, and good Iso/Dense Bias resulted.

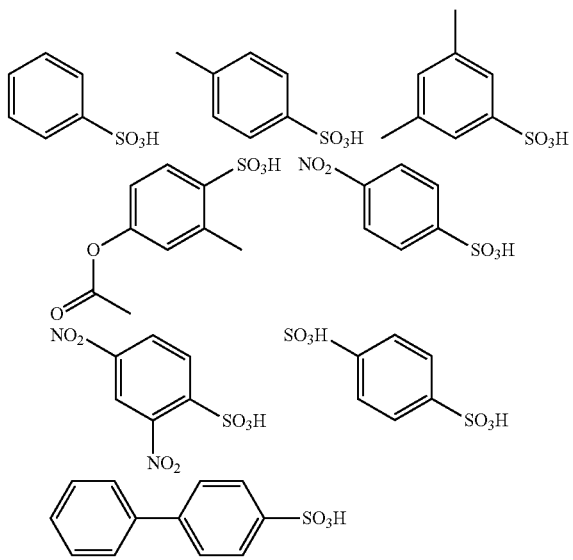

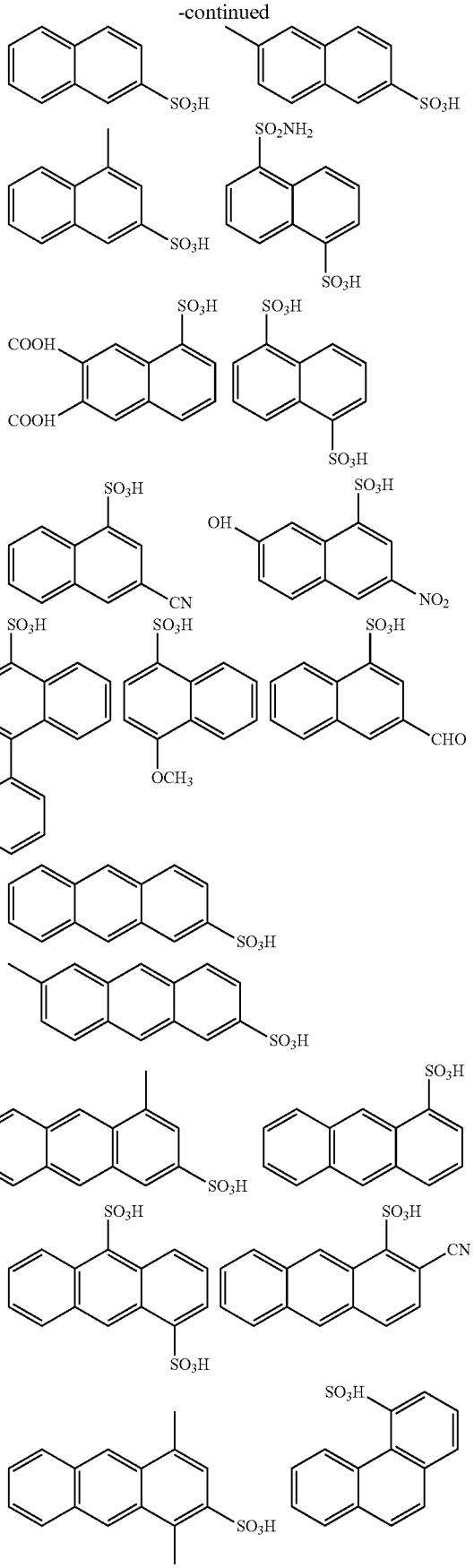

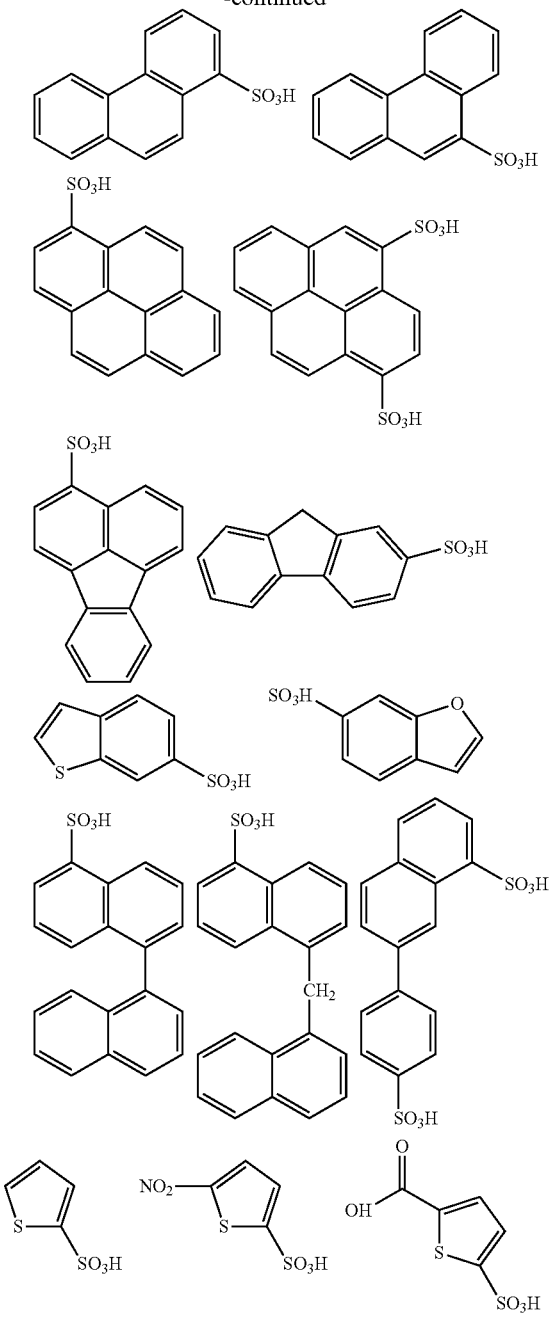
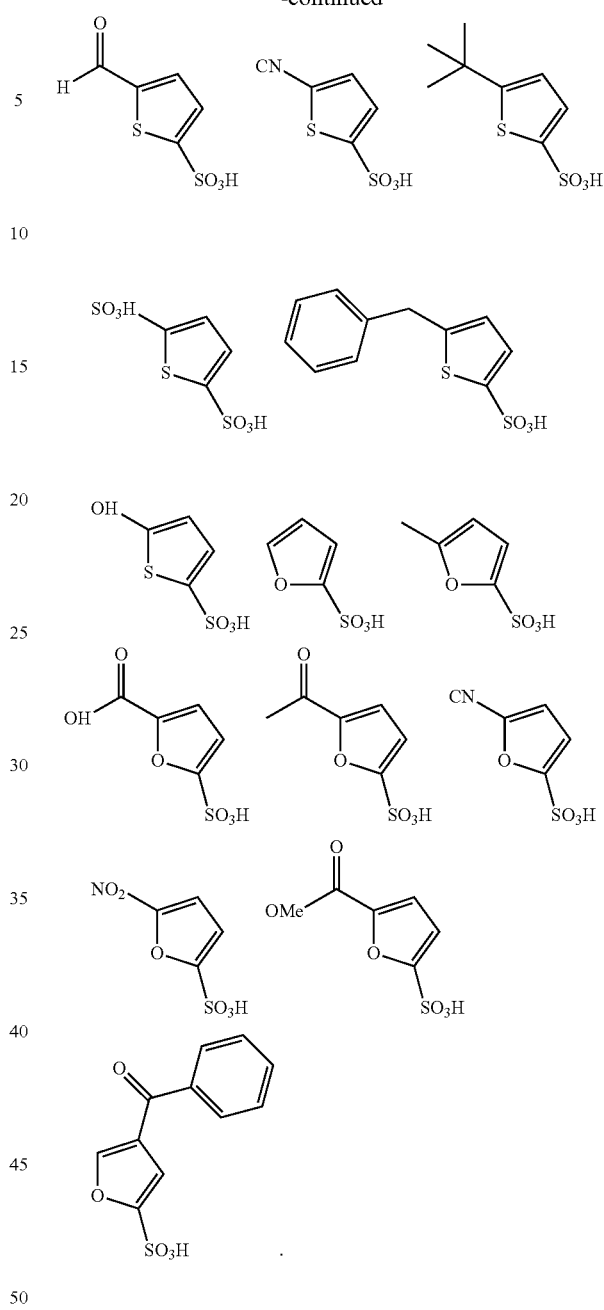

What is claimed is:

1. A photoresist pattern trimming composition, comprising:
   a matrix polymer comprising a unit formed from a monomer of the following general formula (I):

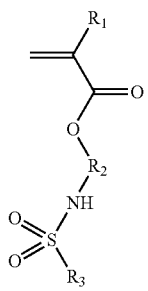

wherein: $R_1$ is chosen from hydrogen, fluorine, $C_1$-$C_3$ alkyl and $C_1$-$C_3$ fluoroalkyl; $R_2$ is chosen from $C_1$-$C_{15}$ alkylene; and $R_3$ is chosen from $C_1$-$C_3$ fluoroalkyl;
an aromatic acid that is free of fluorine; and
a solvent.

2. The photoresist pattern trimming composition of claim 1, wherein the matrix polymer comprises a further unit comprising a fluoroalcohol group.

3. The photoresist pattern trimming composition of claim 2, wherein the matrix polymer comprises a further unit comprising a sulfonic acid group.

4. The photoresist pattern trimming composition of claim 1, wherein the matrix polymer comprises a further unit comprising a sulfonic acid group.

5. The photoresist pattern trimming composition of claim 1, wherein the aromatic acid comprises an acid of the general formula (I):

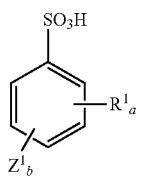

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a+b is 5 or less.

6. A method of trimming a photoresist pattern, comprising:
   (a) providing a semiconductor substrate;
   (b) forming a photoresist pattern on the substrate, wherein the photoresist pattern is formed from a chemically amplified photoresist composition comprising: a matrix polymer comprising an acid labile group; a photoacid generator; and a solvent;
   (c) coating a photoresist trimming composition of any one of claims 1 to 5 on the substrate over the photoresist pattern;
   (d) heating the coated substrate, thereby causing a change in polarity of the photoresist matrix polymer in a surface region of the photoresist pattern; and
   (e) contacting the photoresist pattern with a rinsing agent to remove the surface region of the photoresist pattern, thereby forming a trimmed photoresist pattern.

7. The method of claim 6, wherein the solvent of the trimming composition comprises an organic solvent.

8. The method of claim 6, wherein the trimming composition is an aqueous solution.

9. The method of claim 6, wherein the rinsing agent comprises water or an aqueous alkaline solution.

10. The method of claim 6, wherein the rinsing agent comprises an organic solvent or solvent mixture.

11. The photoresist pattern trimming composition of claim 1, wherein the monomer of general formula (I) is chosen from the following monomers:

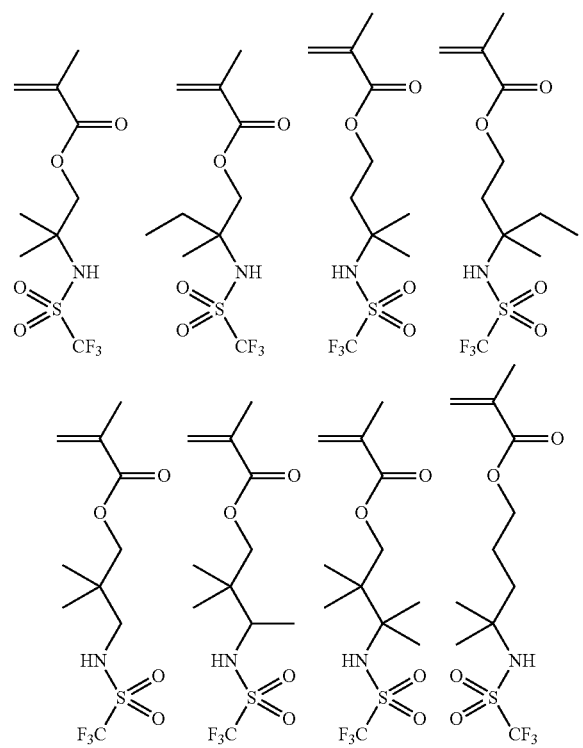

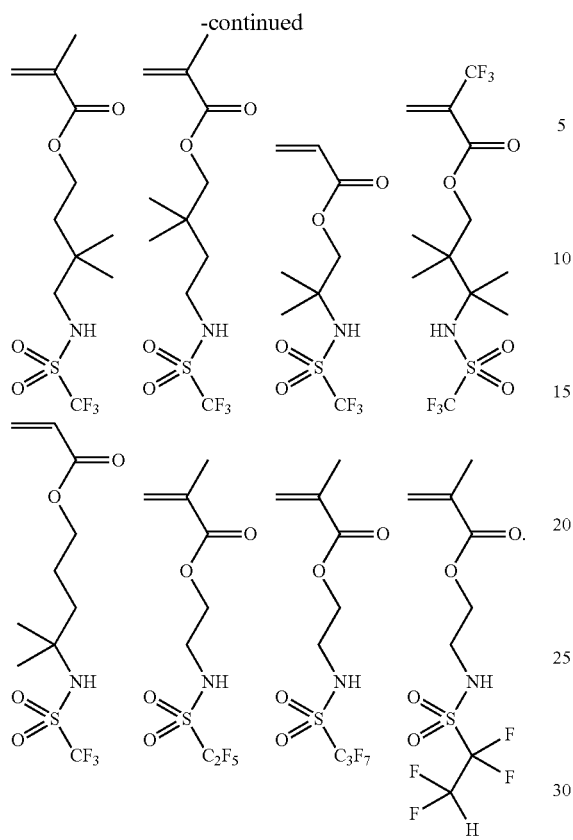

12. The photoresist pattern trimming composition of claim 2, wherein the fluoroalcohol group is a hexafluoroalcohol group.

13. The photoresist pattern trimming composition of claim 2, wherein the unit comprising the fluoroalcohol group formed from a monomer represented by the following general formula (II):

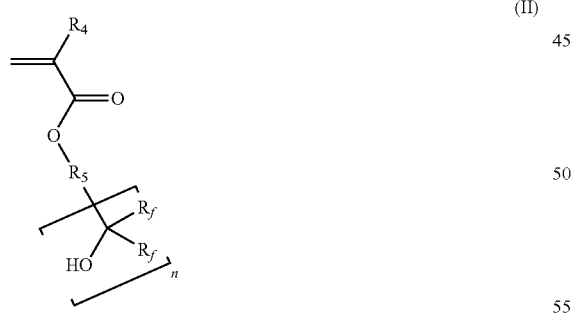

(II)

wherein: $R_4$ is chosen from hydrogen, fluorine, $C_1$-$C_3$ alkyl and $C_1$-$C_3$ fluoroalkyl; $R_5$ is an n+1 valent group chosen from $C_1$-$C_{15}$ alkylene, and may be straight-chained, branched, cyclic or a combination thereof; and $R_f$'s are independently chosen from $C_1$-$C_3$ fluoroalkyl, and may be straight-chained or branched; and n is an integer from 1 to 4.

14. The photoresist pattern trimming composition of claim 13, wherein the monomer of general formula (II) is chosen from the following monomers:

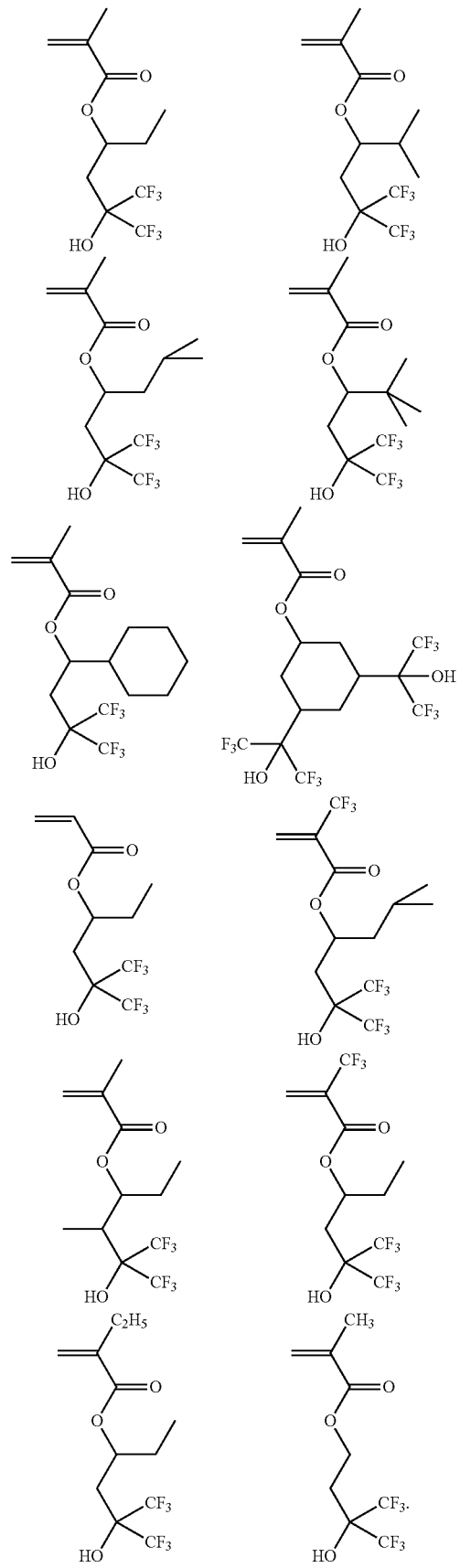

15. The photoresist pattern trimming composition of claim 1, wherein the unit comprising the sulfonic acid group is chosen from the following monomers:

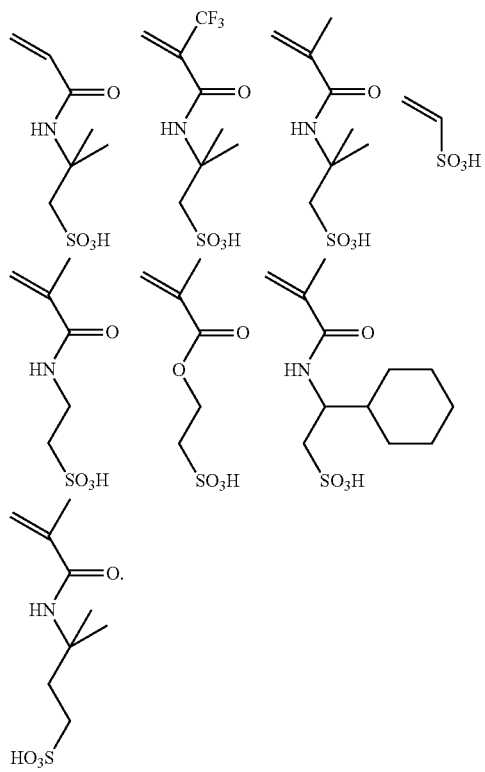

16. The photoresist pattern trimming composition of claim 1, wherein the matrix polymer is made up only of poly(meth)acrylate and/or poly(meth)acrylamide units.

17. The photoresist pattern trimming composition of claim 1, further comprising one or more additional polymer.

18. The photoresist pattern trimming composition of claim 1, wherein the aromatic acid is chosen from the following acids: